United States Patent [19] [11] 3,728,584
Kuhlow [45] Apr. 17, 1973

[54] SEMICONDUCTOR DEVICE MOUNTING ADAPTER

[75] Inventor: Robert J. Kuhlow, Brookfield, Wis.

[73] Assignee: General Motors Corporation, Detroit, Mich.

[22] Filed: June 21, 1971

[21] Appl. No.: 155,058

[52] U.S. Cl. ..........317/100, 174/DIG. 5, 174/152 R, 317/234 A

[51] Int. Cl. ..........H01l 1/12

[58] Field of Search ..........174/16, DIG. 5, 152 R; 317/100, 234 A

[56] References Cited

UNITED STATES PATENTS 3,352,989 11/1967 De Leonardis ..........174/152 R
3,377,524 4/1968 Bock ..........317/234 A
3,573,567 4/1971 Harris ..........174/DIG. 5

OTHER PUBLICATIONS

Electronic Products News, Electronic Design, "Boron Nitride," Vol. 11, No. 20, 9/27/63, pg. 47.

*Primary Examiner*—Robert K. Schaefer
*Assistant Examiner*—Gerald P. Tolin
*Attorney*—William S. Pettigrew et al.

[57] ABSTRACT

An adapter assembly is described for electrically insulating a stud mount semiconductor device from its supporting heat sink while maintaining good thermal communication between them. An externally and internally threaded boron nitride tubular adapter is threaded into a heat sink recess. The semiconductor device stud is threaded into the adapter.

1 Claim, 2 Drawing Figures

INVENTOR.
Robert J. Kuhlow
BY
Robert J. Wallace
ATTORNEY

SEMICONDUCTOR DEVICE MOUNTING ADAPTER

The invention herein described was made in the course of work under a contract or subcontract thereunder with the Department of Defense.

BACKGROUND OF THE INVENTION

This invention concerns a thermally conductive and electrically nonconductive adapter for stud mounting semiconductor packages on an electrically conductive heat sink.

High power semiconductor devices are generally mounted on a heat conductive support to facilitate rapid dissipation of heat generated by the semiconductor wafer within the device package. Some packages, such as power diode packages, have an integral threaded stud on the package base. In such instance, the package can be secured to a heat sink by simply threading the stud into a complementarily threaded heat sink recess. The package base and the heat sink are in good electrical and thermal communication in this latter arrangement. If the diode wafer in the package is soldered to the package base, or to an intermediate metal member, no separate electrical contact to the package base is needed. One needs only to make connection to the heat sink. Also, it is to be noted that a plurality of such devices mounted on that heat sink would be electrically connected in parallel.

On the other hand, one may want the semiconductor wafer in a given stud mount package electrically isolated from the heat sink. If so, he can use a special package in which the diode wafer in it is electrically insulated from the package base. However, if one does not have such a specially insulated stud mount package, or prefers not to use one, he must electrically insulate the package base member from the heat sink, and provide a separate electrical connection to the package base member.

In the past, one insulated the base member with an insulating ferrule, two insulating washers, and a clamping nut. Moreover, the package stud had to project through the backside of the heat sink sufficiently to accommodate the insulating washers and a clamping nut. Such an assembly required access to both sides of the heat sink during assembly. In addition, it frequently required special machining or design of the heat sink backside to accommodate the clamping nut. This, of course, complicated assembly and added to assembly costs. Further, such an arrangement unduly restricted heat flow from the package base into the heat sink. Hence, the power rating of such an assembly could be undesirably restricted.

Objects and Summary of the Invention:

It is an object of this invention to provide a thermally conductive and electrically insulative adapter for attaching stud mount semiconductor devices to a heat sink. Another object of the invention is to provide an improved assembly means for mounting such devices that does not require access to the heat sink backside. It is also an object of this invention to provide a simple means for electrically insulating an uninsulated wafer in a stud mount package from the supporting heat sink for the package without unduly restricting heat flow from the package to the heat sink.

These and other objects of the invention are attained with a mounting adapter made of boron nitride. The adapter is an externally and internally threaded tubular article having a circumferential flange at one end. The other end is threaded into a complementarily threaded heat sink recess. The mounting stud of the semiconductor package is threaded into the flanged end of the boron nitride adapter. A metal washer having a contact lug is nested around the stud between the adapter flange and the base of the semiconductor package, to facilitate making an electrical connection to the semiconductor package base. Boron nitride provides excellent thermal conductivity and electrical isolation. Moreover, it is readily machinable to desired configurations, but also is strong and durable enough to provide a rugged mounting assembly.

Brief Description of the Drawing:

Other objects, features and advantages of this invention will become more apparent from the following description of a preferred assembly thereof and from the drawing, in which.

Figure 1:
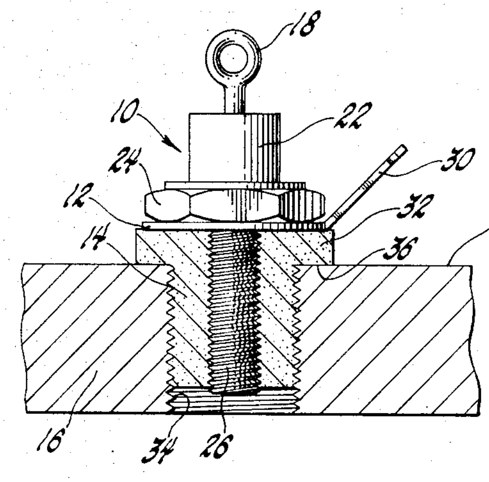
FIG. 1 shows a sectional view of an assembly which includes the boron nitride adapter of this invention.
Figure 2:
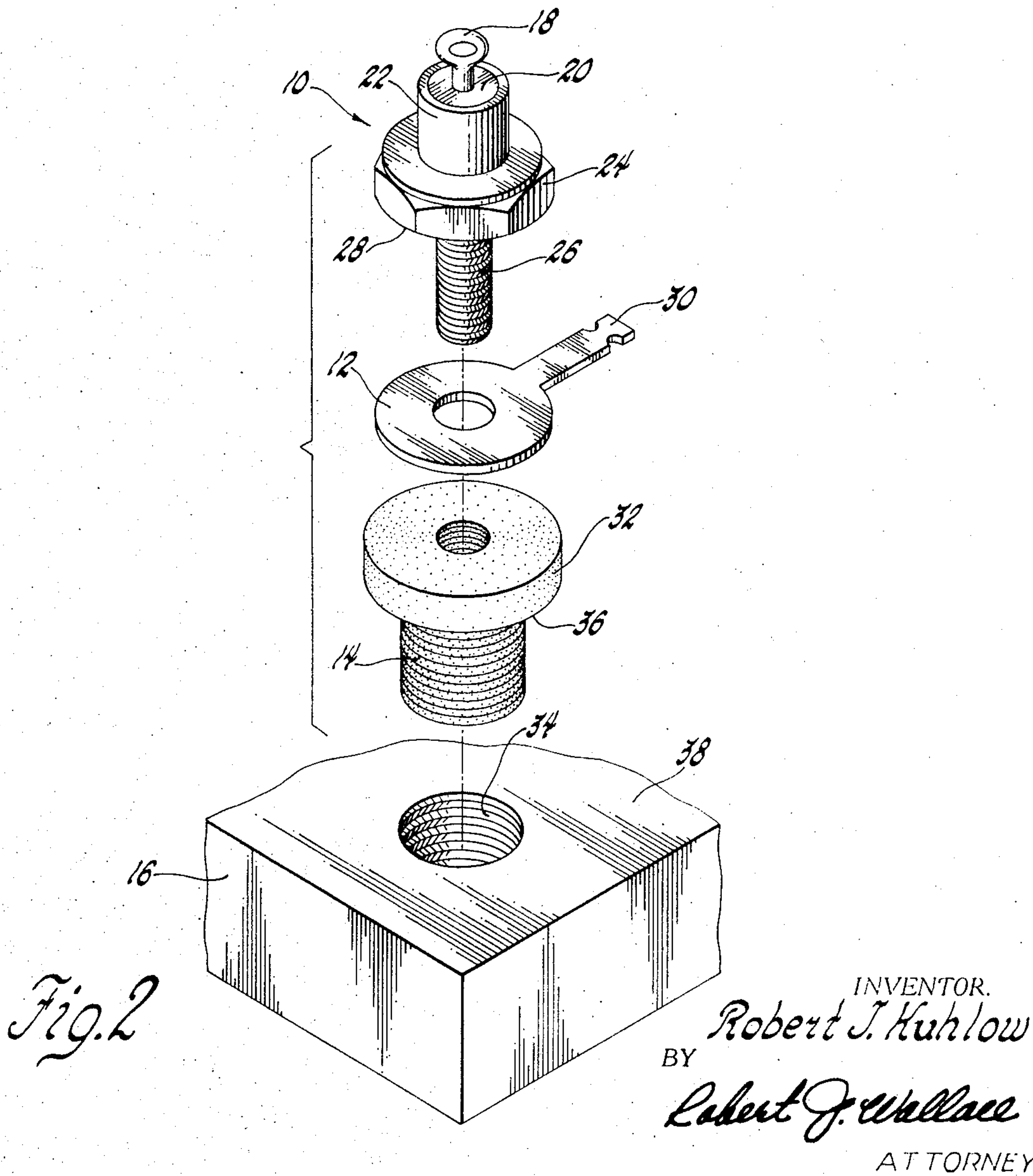
FIG. 2 is an exploded isometric view of the assembly shown in FIG. 1.

Description of the Preferred Embodiments:

The assembly shown in FIGS. 1 and 2 of the drawing includes a high power stud mount rectifier package 10, a connector washer 12, a generally tubular boron nitride adapter 14 and a heat sink element 16. The rectifier package 10 has an upper connector 18 extending from a glass seal 20 within the upper end of a hat-shaped cover member 22. A rectifier wafer (not shown) is mounted on the package base member 24 within the cover member 22. The wafer is in good thermal and electrical contact with base member 24. Normally, the wafer is soldered to a molybdenum or tungsten plate, which is in turn soldered to the base member 24. In any event, there is a low electrical and thermal resistance between the wafer and base member 24.

Base member 24 has a mounting stud 26 projecting from it. Generally base member 24 is of solid copper and stud 26 is an integral solid extension of it. However, other materials and constructions can be used to provide the base member and stud. For example, the base member can be of aluminum and the stud of a complementary different material. They can be hollowed for coolant flow paths, etc. The radial periphery of base member 24 is hexagonal and stud 26 is threaded to facilitate mounting the package. As can be seen, stud 26 is smaller in diameter than the hexagonal periphery of the base member, providing a shoulder 28 therebetween.

Washer 12 has a lug 30 radially extending from it to facilitate making an electrical connection to the package when mounted using the adapter 14 of this invention. The washer 12 is nested around stud 26 and clamped between shoulder 28 on the package base member 24 and the upper surface of adapter 14. With the washer thus positioned electrical connection can be made by soldering a terminal wire (not shown) to lug 30.

Adapter 14, as previously noted, is made of boron nitride. It is a substantially tubular element both internally and externally threaded and having a radial flange 32 at one end. The threads on the outer surface match those within recess 34 in heat sink element 16. The internal threads of adapter 14 match those on stud 26. Consequently, one need only thread the adapter 14 into recess 16 to fasten the adapter in place and then thread stud 26 into adapter 14 to fasten the package 10 in place. Should it be desired, additional locking means such as washers, resin binders, etc., can be used to maintain the assembly tightly engaged even under vibration.

The periphery of radial flange 32 of adapter 14 can be knurled or flatted, if desired, to facilitate threading it into recess 34. Shoulder 36 should be drawn snugly against surface 38 of heat sink 16, or an intermediate heat conductive element, to assure best thermal transfer between the diode 10 and heat sink 16.

Although this invention has been described in connection with certain specific examples thereof, no limitation is intended thereby except as defined in the appended claims.

I claim:

1. An assembly comprising a high power semiconductor diode package having a metal base member with a threaded mounting stud projecting from it in which said base member serves as an electrical connection for a semiconductor diode wafer in said package, an electrically conductive cooling member having a threaded recess, a generally tubular boron nitride element having internal and external thread means, said boron nitride element being threaded within said recess, an external shoulder on one end of said tubular element clamped against said cooling member, said package stud threaded within said boron nitride element from said one end, an electrically and thermally conductive washer around said stud and clamped between said package base and said one end of said boron nitride element, and a radially projecting tang on said washer for making a low resistance electrical connection to said package base.

* * * * *